United States Patent [19]
Stein et al.

[11] Patent Number: 5,930,547
[45] Date of Patent: Jul. 27, 1999

[54] PROCESS AND APPARATUS FOR DEVELOPING RADIATION-SENSITIVE, EXPOSED PRINTING FORMS

[75] Inventors: Eckehard Stein, Frankfurt, Germany; Peter Jessen Juergensen, Virum, Denmark

[73] Assignee: AGFA-Gevaert AG, Leverkusen, Germany

[21] Appl. No.: 08/968,041

[22] Filed: Nov. 12, 1997

Related U.S. Application Data

[62] Division of application No. 08/348,818, Nov. 28, 1994, Pat. No. 5,716,743, which is a continuation of application No. 08/017,380, Feb. 12, 1993, abandoned.

[30] Foreign Application Priority Data

Feb. 17, 1992 [DE] Germany .............................. 42 04 691

[51] Int. Cl.$^6$ ..................................................... G03D 13/00
[52] U.S. Cl. ........................... 396/568; 396/578; 396/626; 396/571
[58] Field of Search ..................................... 396/568–571, 396/578, 604, 617, 626, 627, 622; 118/663, 666, 676, 419, 429; 430/30, 300, 302, 309, 326, 331, 399

[56] References Cited

U.S. PATENT DOCUMENTS

| | | | |
|---|---|---|---|
| 4,566,948 | 3/1986 | Lawson et al. | 396/571 |
| 4,882,246 | 11/1989 | Ohba et al. | 430/30 |
| 4,952,958 | 8/1990 | Ohba et al. | 396/614 |
| 4,969,002 | 11/1990 | Nakayama | 396/617 |
| 4,977,067 | 12/1990 | Yoshikawa et al. | 430/398 |
| 5,138,353 | 8/1992 | Ohba et al. | 396/627 |
| 5,217,848 | 6/1993 | Uehara et al. | 430/309 |

FOREIGN PATENT DOCUMENTS

| | | |
|---|---|---|
| 0 107 454 | 5/1984 | European Pat. Off. . |
| 0 383 314 | 8/1990 | European Pat. Off. . |
| 30 07 401 | 9/1980 | Germany . |
| 4-15653 | 1/1992 | Japan . |

OTHER PUBLICATIONS

Tipler, Physics, vol. 2, pp. 767, 890–891 & 930–933 (1976).
Patent Abstract, JP–A–59 121 047, vol. 008, No. 248 (P–313)14, Nov. 14, 1984.

(List continued on next page.)

*Primary Examiner*—D. Rutledge
*Attorney, Agent, or Firm*—Foley & Lardner

[57] ABSTRACT

An apparatus for developing radiation-sensitive, exposed printing forms into printing plates is disclosed. The apparatus has a developer pan in which a developer bath 2 is situated. The individual printing form runs through the developing station of this apparatus in a running-through plane. On both sides of the running-through plane there are a first pair of transport rollers, two brushing rollers with their counter-rollers and a second pair of transport rollers at the end of the developing station. Arranged between the first pair of transport rollers and the first brushing roller with its counter-roller, on the underside of the running-through plane, are guide rollers. A closed vessel, filled with developing solution, is connected via a developer circuit and a pump to the developer bath. In the vessel there are a temperature sensor and a measuring electrode for the electric conductivity of the developing solution. The temperature sensor and the measuring electrode are connected to a computer, so too is a sensor, which is arranged underneath a feeding table for the printing forms. Data, such as formats of the printing forms, characteristic lines of the specific conductivity of the developing solution for various printing form types, set temperature values and temperature coefficients for the conductivity of the developing solution, are stored in the computer. The computer is also connected to pumps for metered feeding of developing replenisher and water into the developer bath and to a cooling device as well as a heating device within the developer bath.

12 Claims, 3 Drawing Sheets

OTHER PUBLICATIONS

Patent Abstract, JP–A–61 061 164, vol. 010, No. 225 (P–484)6, Aug. 6, 1986.

Patent Abstract, JP–A–22 67 560, vol. 015, No. 023 (P–1155)18, Jan. 18, 1991.

Patent Abstract, JP–A–31 77 843, vol. 015, No. 430 (P–1270)31, Oct. 31, 1991.

Patent Abstract, JP–A–40 15 653, vol. 016, No. 171 (P–1343)24 Apr. 24,1992.

Patent Abstract, JP–A–11 80 548, vol. 013, No. 464 (P–947)20, Oct. 20, 1989.

Patent Abstract, JP–A–60 252 351, vol. 010, No. 127 (P–455)(2184), May 136, 1986.

Patent Abstract, JP–A–60 257 449, vol. 010, No. 135 (P–457)(2192), May 20,1986.

PROCESS AND APPARATUS FOR DEVELOPING RADIATION-SENSITIVE, EXPOSED PRINTING FORMS

This application is a division of application Ser. No. 08/348,818, filed Nov. 28, 1994, U.S. Pat. No. 5,716,743, which is a continuation of application Ser. No. 08/017,380, filed Feb. 12, 1993 abandoned.

BACKGROUND OF THE INVENTION

The present invention relates to a process and an apparatus for developing radiation-sensitive, exposed printing forms with constant developer efficacy in a developing solution, the electric conductivity of which is continuously measured.

EP 107,454 discloses a processing process and apparatus for a number of imagewise-exposed radiation-sensitive plates which are brought into contact with a processing fluid. Changes in the electric conductivity of the processing fluid during the process are observed and the processing conditions are varied in response to changes in the electric conductivity. The processing fluid is either a developing fluid, a finisher or a hydrophilizing agent. Furthermore, a lithographically inert material which is ionized in solution may be added to the processing fluid, in order to increase the electric conductivity.

This apparatus for processing the imagewise-exposed, radiation-sensitive plates comprises a container for the processing fluid and a device for moving the plates along a path through the apparatus, so that they are in contact with the processing fluid. The apparatus includes a device for measuring the electric conductivity of the processing fluid and for generating an output signal in response to the conductivity and a device for changing the processing conditions in response to the output signal. The device for changing the processing conditions includes, inter alia, a variable speed motor for driving the plate-moving device, the motor being controlled by the output signal in such a way that the time interval during which the plates are in contact with the processing fluid depends on the conductivity of the processing fluid. In the case of this process and the apparatus provided for it, it is assumed that, with constant electric conductivity or constant conductance, an identical reproduction is always obtained after the development of the plates.

DE 3,007,401 discloses a process for developing an imagewise-exposed, positive-working, light-sensitive lithographic printing plate and for keeping constant the activity of an alkaline developer during the development. A first addition with a higher alkalinity than that of the alkaline developer is added upon each treatment of the light-sensitive material. A second addition with a higher alkalinity than that of the developer is added either continuously in a certain quantity or at certain intervals in certain quantities. The first addition or the first replenisher is added to the developer in a certain quantity proportional to the length of a side of the light-sensitive material to be treated.

The radiation-sensitive printing forms, in particular lithographic printing forms, to be developed into printing plates in the prior art, generally comprise a metal substrate, in particular an aluminum substrate, which is mechanically or chemically roughened in order to obtain a correspondingly suitable hydrophilic surface, to which a radiation-sensitive coating is then applied. Such printing forms with radiation-sensitive layers are exposed in an imagewise manner through a positive or negative transparency. The incident radiation changes the solubility of the radiation-sensitive coating. Subsequently, the imagewise-exposed printing form is processed by bringing the exposed printing form into contact with a developing solution in order to remove selectively those areas of the coating not required for the image development. After the developing step, the printing form is generally cleaned and washed and treated with a finisher and hydrophilizing agent, the main purpose of this step being to protect the developed printing plate and/or hydrophilize the non-image areas.

In the development of exposed printing forms into printing plates, the problem arises that the developer or the developing solution is weakened by the developing operation. This weakening of the developer leads to a darker or fuller image reproduction on the printing form, which in no way meets the requirement for a standardized printing of the finished printing plate.

The monitoring of the image reproduction is generally carried out by simultaneously copying test elements. As soon as a weakening of the developer efficacy is established by means of the test elements, the weakened developer solutions are refreshed or strengthened by additions of a replenisher. The efficacy of this replenisher addition is likewise tested by simultaneously copying test elements and/or by measuring the electric conductivity or the conductance.

In practice it has been discovered that different known developing systems comprising developer or developing solution and replenisher for refreshing the developing solution and for setting the developer efficacy to a constant value have a different dependence on the conductance or the electric conductivity of the developer solution over a certain period of time, the conductance being dependent on the throughput in terms of surface area of printing forms through the developing solution. For instance, in processing installations in which the development is performed by means of the conductance or by means of controlling the conductance, it is shown that, when changing over an already installed developing system to a new developing system, the previously practiced maintaining or constant control of the conductance, with the result of a constant developer efficacy, in the new developing system leads to a constant weakening or a constant increase of the developer efficacy, with the developing solution consequently becoming unusable. As a result, use of the ready-installed processing installation for the new developing system comprising developer and replenisher is not possible.

SUMMARY OF THE INVENTION

It is therefore an object of the present invention to provide an apparatus and process with constant developer efficacy over time by addition of replenisher to a weakened developer. The apparatus and process are not affected by the dependence of the electric conductivity of the developing solution on the throughput in terms of surface area of printing forms through the developing solution.

These and other objects according to the invention are achieved by a process for developing radiation-sensitive, exposed printing forms in a developing solution, the electric conductivity of which is measured during development, comprising the steps of determining, for a class of printing forms, a relationship between specific conductivity of a developing solution and surface-area throughput of the printing forms through the developing solution, thereby to provide set values for conductivity based on surface-area throughput; measuring conductivity of the developing solution during processing of printing forms to obtain an actual value of conductivity, the actual value corresponding to a known surface-area throughput; comparing the actual value of conductivity at the known surface-area throughput with the set value of the conductivity for surface-area throughput equal to the known surface-area throughput; and maintaining developer efficacy in the developing solution by changing the conductivity of the developing solution in the direction of the set value in the event of deviations of the actual value from the set value.

Also provided according to the present invention is an apparatus for developing radiation-sensitive, exposed printing forms, comprising developing means for containing a developer solution; transporting means for transporting printing forms through the developer solution in a running-through plane; storing means for storing a relationship between specific conductivity of the developing solution and surface-area throughput of printing forms through the developing solution, thereby to provide set values for conductivity based on surface-area throughput; first measuring means for measuring conductivity of the developing solution during processing of printing forms to obtain an actual value of conductivity; second measuring means for measuring surface-area throughput of printing forms through the developer solution; comparing means for comparing the actual value of conductivity at the known surface-area throughput with the set value of the conductivity for surface-area throughput equal to the known surface-area throughput; and means for maintaining developer efficacy in the developing solution by changing the conductivity of the developing solution in the direction of the set value in the event of deviations of the actual value from the set value.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1:
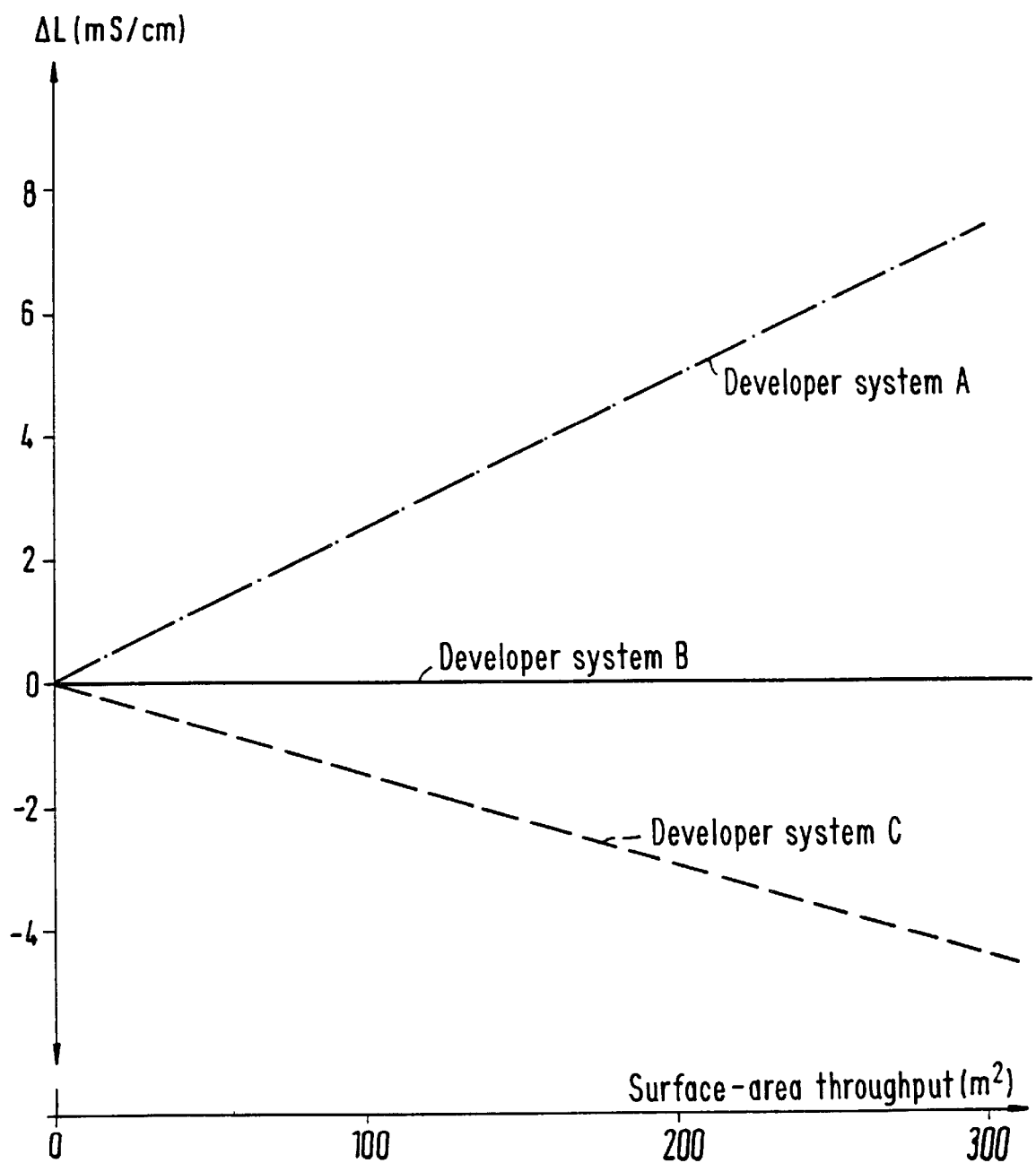
FIG. 1 is a graph showing characteristic lines of the electric conductivity of different developer systems, comprising developer and replenisher, in dependence on surface-area throughput of printing forms through the developing solution.

According to the present invention, a characteristic line of the specific conductivity of the developing solution for the individual printing form type is measured in dependence on the surface-area throughput of the printing forms through the developing solution and stored as a set characteristic line, the actual value of the conductivity of the developing solution being measured in response to the surface-area throughput of the printing forms through the developing solution and compared with the corresponding value of the set characteristic line. In the event of deviations of the actual value from the set value, the conductivity of the developing solution is controlled in the direction of the set value by the addition of developer replenisher or water to said developing solution.

In the process, the dwell time of the individual printing form in the developing solution, the temperature and the motion of the developing solution are kept constant. It is to be assumed in this case that, in terms of the process the characteristic line of the specific conductivity of the developing solution for the individual printing form type rises, remains constant or falls in response to the surface-area throughput of the printing forms through the developing solution, with constant developer efficacy.

If, during the process, a deviation of the actual value of the conductivity from the set value occurs in the upward direction, water is fed in a metered manner to the developing solution to lower the electric conductivity. If, on the other hand, there occurs a deviation of the actual value of the conductivity with respect to the set value in the downward direction, developer replenisher is fed in a metered manner to the developing fluid to increase the electric conductivity. In each case, the metered feeding of water or developer replenisher is performed in small quantities, with deactivated intervals between the individual metering steps.

The present invention also provides an apparatus for developing radiation-sensitive, exposed printing forms which controls to a constant value the developer efficacy in dependence on the surface-area throughput of printing forms.

Such an apparatus has a developer pan for the developing solution and pairs of transport rollers and guide elements for transporting the printing forms through a developing station of the apparatus in a running-through plane. Above there is arranged at least one spray tube for the application of developing solution to at least one brushing roller. A closed vessel, filled with developing solution, is connected via a developer circuit to a developer bath in the developer pan. A temperature sensor and a measuring electrode for the electric conductivity are arranged inside the vessel and are connected to a computer in which data, such as formats of the printing forms, characteristic lines of the specific conductivity of the developing solution for various printing form types, set temperature values and temperature coefficients for the conductivity of the developing solution are stored. The computer is connected to pumps for metered feeding of developer replenisher and water into the developer bath and to a cooling device as well as a heating device within the developer bath.

An advantage of the present invention is that, by the addition of replenisher to a weakened developing solution, the developer efficacy can be kept constant over the entire processing period, uninfluenced by whether the characteristic line of the electric conductivity of the developing solution for the individual printing form type rises, remains constant or falls in dependence on the surface-area throughput of the printing forms through the developing solution. Because of this controlling of the developer efficacy, interventions into such process conditions as the dwell time of the printing form in the developing solution, or into the developer temperature and the developer motion, are not necessary.

In FIG. 1, characteristic lines of the conductivity of three different developer systems are shown. Each line corresponds to a certain developing solution and a replenisher appropriately adjusted to it of Messrs. Hoechst AG, Frankfurt am Main, Germany. Conductivity is represented in dependence on the surface-area throughput of printing forms. On the ordinate, the change in conductivity with respect to fresh, uncharged developing solution with the conductivity $L_0$ is plotted in $10^{-3}$ Siemens/cm. In the abscissa, the throughput of printing forms or exposed plates is plotted in square meters. These characteristic lines were in each case determined in the same processing installation VA 85P of Hoechst AG. The developer systems A, B and C show different behavior depending on the surface-area throughput of printing forms. The conductivities of two of the represented developer systems A and C change with the surface-area throughput. The type of change depends on whether the developer additionally introduces ions into the developing solution by beginning to dissolve aluminum or $Al_2O_3$ from the aluminum substrate of the printing form, which increases the conductivity, or whether ions decrease in the developing solution, for example, due to electric neutralization by means of introduced cations, which decreases the conductivity of the developer system.

In the case of developer system B, the increase and decrease of ions in the developing solution are approximately in equilibrium, so that the electric conductivity of the developing solution remains substantially constant during processing. In the case of developer system A, the conductivity or the conductance must increase over the surface-area throughput, in order to achieve constant developer efficacy and consequently constant image reproduction. In the case of developer system B, the conductivity must be kept constant in order to maintain constant developer efficacy and constant image reproduction. The developer system C requires a decrease in the conductivity over the surface-area throughput in order to achieve constant developer efficacy and constant image reproduction.

It is evident from FIG. 1 that a pure conductance measurement performed independently of the surface-area throughput of printing forms is not sufficient to control the developer efficacy to a constant value. Without constant developer efficacy, constant image reproduction cannot be ensured.

It is shown that the electric conductivity within a certain processing period of time is a derived variable which directly depends on the processed printing form surface area or plate surface area and on design features of the developing station of the processing installation. Since the design features of the developing station represent a constant influencing variable on the conductivity, a direct assignment of a specific conductivity for each surface-area throughput of printing forms in a certain developing solution is obtained for each type of processing installation. The registering of the mutually assigned pairs of values from surface-area throughput of printing forms and the respective electric conductivity of a certain developer system produces the characteristic lines shown in FIG. 1 as a function of the surface-area throughput. These characteristic lines form the basis for controlling the conductivity or the conductance of the respective developing solution within the developing station of a processing installation, as is explained in more detail below with reference to FIG. 2.

The diagrammatic representation shows a processing installation having a developing station, not designated any more specifically, which contains developer pan 1 with developer bath 2. Arranged in developer bath 2 are cooling device 3 and heating device 4, which are connected via control leads 29 to computer 26 outside the developing station. The individual printing form moves in running-through plane 10 through the developing station. At the beginning of the developing station there is feeding table 9 for the printing form, underneath which is arranged sensor 25, which is connected electrically to computer 26. Sensor 25 detects the printing form type and registers the dimensions or the surface area of the individual printing form and enters these data into computer 26 via measuring lead 27.

For transporting the printing form within the developing station and above developer bath 2 there are provided in each case at the beginning and at the end of the developing section a pair of transport rollers 5. Arranged after the first pair of transport rollers 5 are guide rollers 8, which ensure a flat lie of the printing form during movement through the through-running plane 10 to brushing rollers 6. The two brushing rollers 6 bear against counter-rollers 7 and form with the latter a gap, through which the printing form runs. Above running-through plane 10 are spray tubes 11 for application of the developer, which tubes are connected via common supply line 12 to pump 13 for the feeding of developing solution to the spray tubes. Pump 13 is in direct connection by a further supply line 12 with developer pan 1, so that in each case developing solution from developer bath 2 in developer pan 1 is delivered by pump 13 to spray tubes 11. Two of these spray tubes apply the developer directly to brushing rollers 6, whereas one of these spray tubes sprays the surface of the printing form to be developed with developer directly after the first pair of transport rollers 5.

The elements for controlling the developer efficacy are located outside developer pan 1 and comprise, inter alia, closed vessel 14, which is filled with developing solution and is connected by means of developer circuit 17, 17 to developer bath 2 in developer pan 1. Inside vessel 14, which is completely filled with developing solution, are temperature sensor 15 and measuring electrode 16, which are in each case connected with computer 26 via measuring leads 27. Arranged furthermore in developer circuit 17, 17 is pump 18, which ensures that developing solution in each case flows out of developer bath 2 via developer circuit 17, 17 through vessel 14. The respective actual value of the temperature of the developing solution is measured in vessel 14 by temperature sensor 15, whereas measuring electrode 16 registers the electric conductivity of the developing solution and passes the respective actual value of this conductivity via measuring lead 27 to computer 26. In computer 26 there are stored various data, such as the formats of the printing forms, i.e., their surface-area dimensions, as well as characteristic lines of the specific conductivity of the developing solution for various printing form types, set temperature values and temperature coefficients for the conductivity of the developing solution. Furthermore, activating times for pumps 20, 23 for the addition of replenisher and standstill times for pumps 20, 23 after the metering operation are stored in the computer. Additional stored data include the permissible system deviations of the electric conductivity or of the conductance from the set values as well as the maximum permissible surface-area throughput per developer bath.

For controlling the developer efficacy there are, furthermore, replenisher reservoir 19, which is connected to developer bath 2 via pump 20 and via connecting line 21, and water reservoir 22, which is likewise connected to developer bath 2 via pump 23 and connecting line 24. Pump 20 pumps developer replenisher out of replenisher reservoir 19 via line 21 into developer bath 2 as soon as computer 26 sends an output signal to the pump motor via a first electric connecting lead 28. If computer 26 sends an output signal to the pump motor via a second electric connecting lead 28, water is pumped out of water reservoir 22 via line 24 by pump 23 into developer bath 2. Control signals are also sent by computer 26 via control leads 29 to cooling device 3 and/or heating device 4, in order to set the developing solution in developer bath 2 to the set temperature value.

The control of the developer efficacy within a processing cycle of the developer bath or of the developer filling in developer bath 1 takes place as follows. First, the following process data are entered into the computer 26 and stored:

formats of the printing forms or plate formats with regard to width×length, characteristic line of the developer with positive or negative slope of the characteristic line or as pairs of values of electric conductivity/surface-area throughput of printing forms, set temperature value of the developer, temperature coefficient of the developer for the electric conductivity, delivery rates of pump 20 for the replenisher and of pump 23 for water, activation times of pumps 20, 23, rest times of pumps 20, 23 after an operating cycle, permissible system deviations of the electric conductivity from the set value, maximum permissible surface-area throughput of printing forms per developer bath.

If the data of the following processing cycles do not change, the already entered and stored values are automatically used again at the beginning of each new processing cycle. After entry and storage of the process data in computer 26, developer pan 1 is filled with fresh developer bath 2 and developer circuit 17 is switched on, i.e., pump 18 in developer circuit 17 is put into operation.

The temperature of the developing solution in developer bath 2 is adjusted to the set temperature plus/minus 2° C. with the aid of heating device 3 and cooling device 4. As already mentioned above, the temperature measurement is performed with the aid of temperature sensor 15 in vessel 14. The control of cooling device 3 and of heating device 4 in developer bath 2 is performed by the entered data on the set temperature value in computer 26. In the next step, the basic value or the first set value of the conductivity is established, which value is decisive for all following calculations of the set value of the conductivity within the processing cycle. For this purpose, the initial conductivity of the developing solution in developer bath 2 is measured by means of measuring electrode 16 for the conductivity and similarly the temperature of the developing solution is measured with the aid of temperature sensor 15. The initial conductivity determined at the measured temperature is corrected in computer 26 to the predetermined set temperature and is the first set conductance, which is stored in computer 26 for following calculations.

Subsequently, the printing forms to be developed are entered into the developing station. In so doing, sensor 25 for registering and detecting the printing form surfaces or plate surfaces is activated. From the number of printing forms running through and the format specifications stored in computer 26, the surface-area throughput of printing forms is calculated and stored in computer 26.

With the aid of the stored characteristic lines for the developing solution, a new set value of the conductivity is calculated in response to the surface-area throughput and compared with the actual value of the conductivity of the developing solution, which is determined by means of measuring electrode 16. As already mentioned above, the measured actual value of the electric conductivity is temperature-compensated with respect to the temperature of the developing solution. If the difference between the set value and the actual value of the conductivity is within the permissible system deviation, as they are stored as process data in computer 26, the processing is continued, without it being necessary to correct the conductivity of the developing solution.

If the difference between the actual value and the set value of the electric conductivity is outside the permissible system deviation of the electric conductivity or of the conductance, as it is stored in computer 26, a correction is made. In the case of a positive deviation, i.e., a deviation in the upward direction, an addition of water takes place from water reservoir 22 with the aid of pump 23 via connecting line 24 into developer bath 2 in developer pan 1. This addition of water accomplishes a lowering of the electric conductivity of developer bath 2.

If there is a negative deviation of the difference between the actual value and the set value of the electric conductivity, replenisher is pumped out of replenisher reservoir 19 with the aid of pump 20 via connecting line 21 into developer bath 2, in order to increase the electric conductivity of the developing solution. The metered feeding is performed in small quantities, in order to rule out overshooting of the control. Between each metered feeding, the respective pump is deactivated during a time interval in which no further metered feeding takes place, in order to ensure optimum mixing throughout of the developing solution in developer bath 2 with the aid of developer circuit 17. The metered feeding is continued until the difference between the actual value and set value of the electric conductivity is within the permissible system deviation with regard to the stored process data.

In the meantime, further printing forms or plates may be fed to the developing station, since the required data are continuously updated. Finally, a check of the sum of processed printing form surface area or plate surface area is performed, in order to establish whether the maximum permissible plate surface area stored as process data has been exceeded or not. If the maximum permissible plate surface area has been exceeded, the monitoring of the developer is suspended, in order to prevent an undesired displacement of developing solution by constant adding of replenisher.

EXAMPLES

Figure 2:
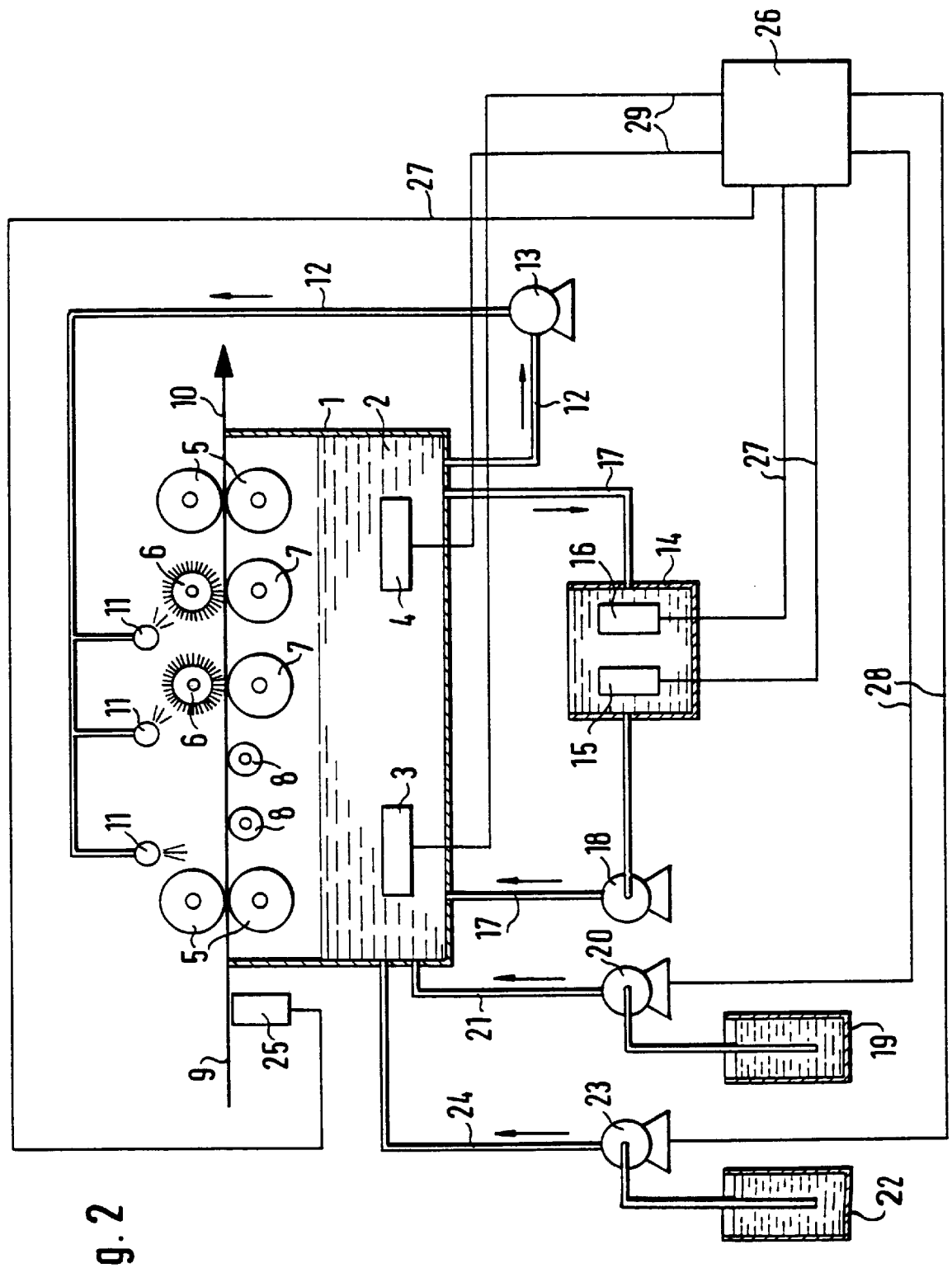
FIG. 2 is a diagrammatic representation of the structure of an apparatus according to the invention in which developing solution is applied to the printing form by spray tubes.

Results achieved with the apparatus according to FIG. 2 are listed in tabular form below. Listed are, in dependence on the plate throughput through the developing station, the actual and set conductance at the time of plate production and the visual evaluation of the plates on the basis of reproductions with the continuous-tone step wedge HOECHST BK02 and the Ugra-Offset test wedge 1982. Decisive for the assessment of the developer efficacy is in this case the reproduction of the circular line fields of the Ugra-Offset test wedge 1982, which form the basis of the standardized offset print. A constant reproduction of the circular lines means constant developer efficacy.

The same starting conditions and processing conditions applied for all the following 3 examples:

Processing installation: Hoechst VA 85 P

Developer provision: 20 liters

Developer temperature: 22° C.

Processing speed: 0.8 m/min

Overall exposed plates: Hoechst P61, P5S, P63, P71, P20 mixed

Imagewise exposed plates: Hoechst P61
Plate throughput/day: variable

Example 1

Developer: Hoechst EP210 Replenisher: Hoechst EP310

| Surface-area throughput (m²) | Set conductance (mS/cm) | Actual conductance (mS/cm) | BK02 clear/solid step | Ugra circular lines (μm) |
|---|---|---|---|---|
| 0 | 85.5 | 85.5 | 4/10 | 15(+) |
| 60 | 84.6 | 84.6 | 4/10(−) | 15 |
| 100 | 84.0 | 83.8 | 4/10(−) | 15 |
| 160 | 83.1 | 83.2 | 4/10(−) | 15(+) |
| 200 | 82.6 | 82.5 | 4/10(−) | 15(+) |
| 260 | 81.6 | 81.8 | 4/10 | 15(+) |

Example 2

Developer: Hoechst EP26 Replenisher: Hoechst EP36

| Surface-area throughput (m²) | Set conductance (mS/cm) | Actual conductance (mS/cm) | BK02 clear/solid step | Ugra circular lines (μm) |
|---|---|---|---|---|
| 0 | 55.9 | 55.9 | 3/9 | 15(+) |
| 60 | 55.9 | 56.2 | 3/9(−) | 15(+) |
| 100 | 55.9 | 56.1 | 3/9 | 15(+) |
| 160 | 55.9 | 55.6 | 3/9(−) | 15(+) |
| 200 | 55.9 | 55.7 | 3/10 | 15(+) |
| 260 | 55.9 | 55.7 | 3/10 | 15(+) |

Example 3

Developer: Hoechst EP260 Replenisher: Hoechst EP361

| Surface-area throughput (m²) | Set conductance (mS/cm) | Actual conductance (mS/cm) | BK02 clear/solid step | Ugra circular lines (μm) |
|---|---|---|---|---|
| 0 | 62.5 | 62.5 | 3/10 | 15(+) |
| 60 | 64.0 | 63.7 | 3/10(−) | 15(+) |
| 100 | 65.0 | 65.0 | 3/10(−) | 15(+) |
| 160 | 66.5 | 66.1 | 3/10(−) | 15(+) |
| 200 | 67.5 | 67.4 | 3/10(−) | 15(+) |
| 260 | 69.0 | 68.9 | 3/10(−) | 15(+) |

The developer system of Example 1 is based on a falling characteristic line for set conductance or conductivity as a function of the surface-area throughput, which corresponds to developer system C in FIG. 1. For the developer system of Example 2, the characteristic line for set conductance as a function of surface-area throughput runs virtually horizontally, which corresponds to developer system B of FIG. 1. In the case of Example 3, the characteristic line for set conductance as a function of surface-area throughput rises, similar to developer system A in FIG. 1.

Figure 3:
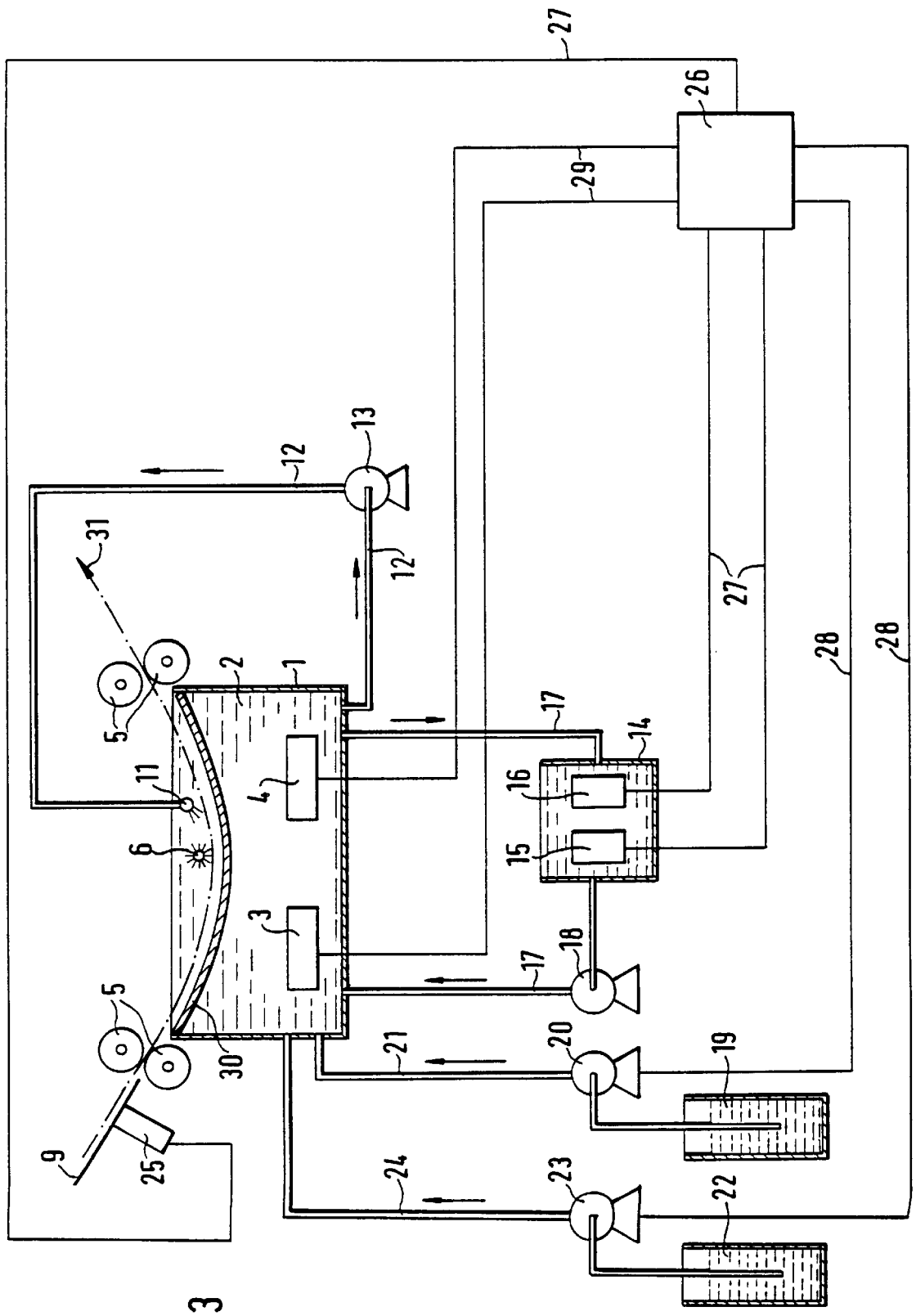
FIG. 3 is a diagrammatic representation of the structure of an apparatus according to the invention in which developing solution is applied in a dipping bath.

FIG. 3 diagrammatically shows the developing station of a processing installation having the design features of a dipping bath development. During the development, the printing form dips directly into the developing solution 2 situated in the developer pan 1. The running through of the individual printing form takes place along a curved running-through plane 31, which is predetermined by one or more guide element(s) 30. On both sides of running-through plane 31 there are a first pair of transport rollers 5 and a second pair of transport rollers 5. Brushing roller 6 with the guide element or elements 30 as counter-bearing is arranged in between and above running-through plane 31. During the running-through of the printing form, developing solution 2 is applied under pressure via spray tube 11 to the layer to be developed of the dipped-in printing form, in order to speed up the developing step.

The control of the developer efficacy is identical in its structure and procedure to that which was described with reference to FIG. 2.

We claim:

1. An apparatus for developing radiation-sensitive, exposed printing forms, comprising:
   developing means for containing a developer solution;
   transporting means for transporting printing forms through the developer solution in a running-through plane;
   a heating means and a cooling means for setting the developer solution to a set temperature value;
   storing means for storing a relationship between specific conductivity of the developing solution and surface-area throughput of printing forms through the developing solution, thereby to provide set values for conductivity based on surface-area throughput;
   first measuring means for measuring conductivity of the developing solution during processing of printing forms to obtain an actual value of conductivity;
   second measuring means for measuring surface-area throughput of printing forms through the developer solution;
   means for measuring temperature of the developing solution;
   comparing means for comparing the actual value of conductivity at a known surface-area throughput with the set value of the conductivity for surface-area throughput equal to the known surface-area throughput; and
   means for maintaining developer efficacy in the developing solution by changing the conductivity of the developing solution in the direction of the set value in the event of deviations of the actual value from the set value.

2. The apparatus as claimed in claim 1, wherein the means for transporting printing forms comprises pairs of transport rollers and guide elements and wherein at least one spray tube for application of developing solution to at least one brushing roller is positioned above the transporting means.

3. The apparatus as claimed in claim 1, wherein the means for containing developer solution comprises a developer bath that is connected via a developer circuit to a closed vessel in which are arranged the first measuring means for measuring conductivity of the developing solution and the means for measuring temperature of the developing solution.

4. The apparatus as claimed in claim 3, wherein the means for measuring conductivity of the developing solution comprises a measuring electrode arranged inside the closed vessel and wherein the storing and comparing means is a computer that is connected to pumps for metered feeding of developer replenisher and water into the developer bath.

5. The apparatus as claimed in claim 4, wherein the second measuring means comprises, in advance of the entry into the developer bath in the running-through plane, a sensor for registering the formats of the printing forms, the sensor being connected to the computer.

6. The apparatus as claimed in claim 3, additionally comprising a pump for circulating developer solution between the closed vessel and the developer bath through the developer circuit.

7. The apparatus as claimed in claim 4, wherein the computer is connected via control leads to a cooling device and a heating device for controlling the developing solution to a set temperature value.

8. The apparatus as claimed in claim 4, additionally comprising values stored in the computer to control the operation of the pumps for metered feeding of developer replenisher and water, the stored values comprising values for delivery rates and for activated and deactivated intervals of the pumps.

9. The apparatus as claimed in claim 1, wherein the running-through plane of the printing forms is flat and wherein spray tubes, pairs of transport rollers, brushing and counter-rollers and guide rollers are arranged above the developer bath.

10. The apparatus as claimed in claim 1, wherein the running-through plane is curved and wherein the developing bath is a dipping bath, into which the running-through plane dips together with a brushing roller and a spray tube for spraying developer.

11. The apparatus as claimed in claim 1, additionally comprising values for the dimensions of the printing form stored in the computer.

12. An apparatus for developing radiation-sensitive, exposed printing forms in a developing solution, the electric conductivity of which is measured during development, comprising:

means for determining, for a class of printing forms, a relationship between specific conductivity of a developing solution and surface-area throughput of the printing forms through the developing solution, by measuring specific conductivity versus surface-area throughput of the class of printing forms, thereby to establish a set characteristic line; means for measuring temperature of the developing solution and specific conductivity of the developing solution during processing of printing forms to obtain an actual value of specific conductivity, the actual value corresponding to a known surface-area throughput, and correcting the actual value depending on said temperature;

means for comparing the actual value of specific conductivity at the known surface-area throughput with a set value of the specific conductivity for surface-area throughput equal to the known surface-area throughput; and means for maintaining developer efficacy in the developing solution by changing the specific conductivity of the developing solution in the direction of the set value in the event of deviations of the actual value from the set value by addition of water or developer replenisher to the developing solution in metered quantities, and means for keeping constant developing solution temperature, developing solution flow past the printing forms during development and dwell time of the printing forms in the developing solution.

* * * * *